United States Patent
Ang et al.

(10) Patent No.: US 9,048,371 B2
(45) Date of Patent: Jun. 2, 2015

(54) SEMICONDUCTOR DEVICES INCLUDING AVALANCHE PHOTODETECTOR DIODES INTEGRATED ON WAVEGUIDES AND METHODS FOR FABRICATING THE SAME

(71) Applicant: GLOBALFOUNDRIES Singapore Pte. Ltd., Singapore (SG)

(72) Inventors: Kah-Wee Ang, Singapore (SG); Purakh Raj Verma, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 14/045,180

(22) Filed: Oct. 3, 2013

(65) Prior Publication Data

US 2015/0097256 A1 Apr. 9, 2015

(51) Int. Cl.
- H01L 21/00 (2006.01)
- H01L 31/107 (2006.01)
- H01L 31/18 (2006.01)
- H01L 31/0232 (2014.01)

(52) U.S. Cl.
CPC ........ H01L 31/1075 (2013.01); H01L 31/1804 (2013.01); H01L 31/02327 (2013.01)

(58) Field of Classification Search
CPC .............. H01L 31/107; H01L 31/1075; H01L 31/02327
USPC ...................................................... 438/69–72
See application file for complete search history.

(56) References Cited

U.S. PATENT DOCUMENTS

| | | | |
|---|---|---|---|
| 6,614,086 B2 | 9/2003 | Kim et al. | |
| 8,399,949 B2 * | 3/2013 | Meade | 257/458 |
| 8,741,684 B2 * | 6/2014 | Bogaerts et al. | 438/69 |
| 2004/0188379 A1 * | 9/2004 | Mikolas | 216/24 |
| 2013/0292741 A1 * | 11/2013 | Huang et al. | 257/186 |

OTHER PUBLICATIONS

Bowers, John E., "High-gain high-sensitivity resonant Ge/Si APD photodetectors," Department of Electrical and Computer Engineering, University of California, Proc. of SPIE, vol. 7660, pp. 1-8.

* cited by examiner

*Primary Examiner* — Matthew W Such
*Assistant Examiner* — Ali Naraghi
(74) *Attorney, Agent, or Firm* — Ingrassia Fisher & Lorenz, P.C

(57) ABSTRACT

Semiconductor devices and methods for fabricating semiconductor devices are provided. In one example, a method for fabricating a semiconductor device includes etching a trench into a waveguide layer in a detector region of a semiconductor substrate. An avalanche photodetector diode is formed about the trench. Forming the avalanche photodetector diode includes forming a multiplication region in the waveguide layer laterally adjacent to the trench. An absorption region is formed at least partially disposed in the trench.

17 Claims, 6 Drawing Sheets

SEMICONDUCTOR DEVICES INCLUDING AVALANCHE PHOTODETECTOR DIODES INTEGRATED ON WAVEGUIDES AND METHODS FOR FABRICATING THE SAME

TECHNICAL FIELD

The technical field relates generally to semiconductor devices and methods for fabricating semiconductor devices, and more particularly relates to semiconductor devices including avalanche photodetector diodes integrated on waveguides and methods for fabricating such semiconductor devices.

BACKGROUND

Silicon photonics uses silicon as an optical medium and has been an active development area in recent years because of its potential monolithic integration with complementary-metal-oxide-semiconductor (CMOS) microelectronic circuits. Silicon is transparent to infrared light with wavelengths above about 1.1 μm and also has a very high refractive index of, for example, about 3.5. The tight optical confinement provided by this high refractive index allows for optical waveguides.

For silicon photonic components, e.g., waveguides and the like, to remain optically independent from the bulk silicon of the semiconductor wafer on which they are fabricated, it is necessary to have a layer of intervening material. Typically silica is used as an intervening material because of its much lower refractive index, about 1.44 in the wavelength region of interest, than silicon and thus, light at the silicon-silica interface will undergo total internal reflection and remain in the silicon. This construction is known as silicon-on-insulator (SOI) and the waveguides formed from this construction are commonly referred to as SOI waveguides. As such, silicon photonic devices can be made using existing semiconductor fabrication techniques, and because silicon is used as the substrate for most integrated circuits, it is possible to create hybrid devices in which the optical and electronic components are integrated onto a single microchip.

An avalanche photodetector or photodiode (APD) is an excellent choice for many optical applications (e.g., optical communication, optical sensing, and optical imaging) because of its internal gain and improved sensitivity. An APD is a highly sensitive semiconductor electronic device that exploits the photoelectric effect to convert light to electricity. An APD can be thought of as a photodetector that provides a built-in first stage of gain through avalanche multiplication. From a functional standpoint, avalanche multiplication can be regarded as a semiconductor analog to photomultipliers. By applying a high reverse bias voltage, e.g., typically about 100 to about 200 V in silicon (avalanche phenomenon as such could be started at as low a voltage as 10V depending upon the diode design), APDs show an internal current gain effect of up to about 100 due to impact ionization (avalanche effect).

However, silicon is not suitable for photodetectors for optical applications using a wavelength ranging from 1.3 to 1.6 μm due to a lack of light absorption of silicon in the near infrared range. One solution is combining a germanium (Ge) layer on top of a silicon (Si) layer because of the high optical absorption of Ge and its compatibility with silicon processes (e.g., CMOS processes). Therefore, a Ge-on-Si construction is very promising for developing separate-absorption-charge-multiplication (SACM) APDs. Integrating Ge APDs onto SOI waveguides offers the advantage of low junction capacitance, efficient power transferring from the waveguide to the Ge APD, and ease of process integration. Unfortunately, current Ge APDs integrated on SOI waveguides typically result in large topographical variation, process complexity, high loss, and reduced optical sensitivity.

Accordingly, it is desirable to provide semiconductor devices including avalanche photodetector diodes integrated on waveguides with reduced topographical variation and methods for fabricating such semiconductor devices. Moreover, it is desirable to provide semiconductor devices including avalanche photodetector diodes integrated on waveguides with reduced process complexity, lower loss, and improved optical sensitivity and multiplication gain. Furthermore, other desirable features and characteristics of the present invention will become apparent from the subsequent detailed description and the appended claims, taken in conjunction with the accompanying drawings and this background.

BRIEF SUMMARY

Semiconductor devices and methods for fabricating semiconductor devices are provided herein. In accordance with an exemplary embodiment, a method for fabricating a semiconductor device includes etching a trench into a waveguide layer in a detector region of a semiconductor substrate. An avalanche photodetector diode is formed about the trench. Forming the avalanche photodetector diode includes forming a first multiplication region in the waveguide layer laterally adjacent to the trench. An absorption region is formed at least partially disposed in the trench.

In accordance with another exemplary embodiment, a method for fabricating a semiconductor device is provided. The method includes forming a first field oxide layer section and a second field oxide layer section overlying a waveguide layer in a detector region of a semiconductor substrate. The first and second field oxide layer sections are spaced apart to expose an intermediate section of the waveguide layer. A trench is etched into the intermediate section of the waveguide layer to form a recessed waveguide layer section that has sidewalls and a lower section extending between the sidewalls. The sidewalls and the lower section are P– doped to form a P– charge layer in the recessed waveguide layer section. A first n-well is formed in the waveguide layer underlying the first field oxide layer section and laterally spaced apart from the P– charge layer to form a first multiplication region in the waveguide layer. The first multiplication region is disposed between the first n-well and the P– charge layer. A second n-well is formed in the waveguide layer underlying the second field oxide layer section and laterally spaced apart from the P– charge layer to form a second multiplication region in the waveguide layer. The second multiplication region is disposed between the second n-well and the P– charge layer. Upper portions of the first and second n-wells are N+ doped for forming first and second N+ electrodes, respectively. Germanium (Ge) is deposited into the trench overlying the P– charge layer to form an absorption region. A P+ electrode is formed along an upper portion of the absorption region.

In accordance with another exemplary embodiment, a semiconductor device is provided. The semiconductor device includes a waveguide that overlies a buried oxide layer of a semiconductor substrate. The waveguide includes a waveguide layer that has a recessed waveguide layer section disposed in a detector region of the semiconductor substrate. An avalanche photodetector diode is disposed about the recessed waveguide layer section. The avalanche photodetector diode includes a multiplication region that is disposed in the waveguide layer laterally adjacent to the recessed waveguide layer section. An absorption region overlies the recessed waveguide layer section.

BRIEF DESCRIPTION OF THE DRAWINGS

The various embodiments will hereinafter be described in conjunction with the following drawing figures, wherein like numerals denote like elements, and wherein:

FIGS. 1-10 illustrate a semiconductor device and methods for fabricating a semiconductor device in accordance with an exemplary embodiment.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to semiconductor devices including avalanche photodetector diodes integrated on waveguides and methods for fabricating such semiconductor devices. The exemplary embodiments taught herein provide a semiconductor device that includes a waveguide that overlies a buried oxide layer of a semiconductor substrate. The waveguide includes a waveguide layer that is formed of silicon and that has a recessed waveguide layer section disposed in a detector region of the semiconductor substrate. In an exemplary embodiment, the recessed waveguide layer section is formed by etching a trench into a portion of the waveguide layer that is disposed in the detector region of the semiconductor substrate. The trench exposes sidewalls and a lower section that extends between the sidewalls of the recessed waveguide layer section.

An avalanche photodetector diode is formed about (e.g., in and/or on and/or around) the recessed waveguide layer section. In an exemplary embodiment, the avalanche photodetector diode includes a first multiplication region and a second multiplication region (e.g., dual multiplication regions) that are disposed in the waveguide layer laterally adjacent to the recessed waveguide layer section. An absorption region formed of germanium (Ge) overlies the recessed waveguide layer section and is disposed between the first and second multiplication regions. In an exemplary embodiment, the dual multiplication regions provide increased multiplication gain over existing APDs that have, for example, a single multiplication region.

In an exemplary embodiment, the avalanche photodetector diode is formed by P– doping the sidewalls and lower section of the recessed waveguide layer section to form a P– charge layer. First and second n-wells are formed in the waveguide layer laterally spaced apart from the P– charge layer, defining the first and second multiplication region in the waveguide layer, respectively, between the P– charge layer and the n-wells. Upper portions of the first and second n-wells are N+ doped for forming first and second N+ electrodes, respectively. Germanium (Ge) is deposited into the trench overlying the P– charge layer to form the absorption region. At least a substantial portion of the absorption region is disposed in the trench overlying the recessed waveguide layer section. As such, the topographical difference between the uppermost surface of the absorption region and the waveguide layer that surrounds the recessed waveguide layer section is offset or reduce by about the depth of the trench compared to if the absorption region had been formed directly on the waveguide layer, thereby reducing topographical variation and reducing subsequent process complexity.

In an exemplary embodiment, a P+ electrode is formed along an upper portion of the absorption region. First metal silicide regions are correspondingly formed in the first and second N+ electrodes, and a second metal silicide region is formed in the P+ electrode. An ILD layer of dielectric material is deposited overlying the avalanche photodetector diode. Contacts are formed extending through the ILD layer to the first and second metal silicide regions. By laterally spacing apart the absorption region and the n-wells, the distance of the corresponding P+ and N+ electrodes and the associated contacts to the avalanche photodetector diode is greater to decrease optical loss and improve optical sensitivity.

Figure 1:
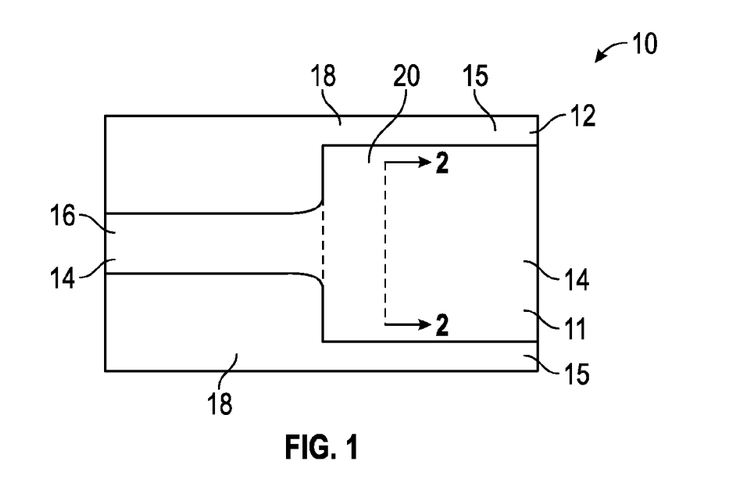
FIG. 1 illustrates, in top view, the semiconductor device at an early fabrication stage.

FIG. 1 illustrates, in top view, a semiconductor device 10 at an early fabrication stage in accordance with an exemplary embodiment. The described process steps, procedures, and materials are to be considered only as exemplary embodiments designed to illustrate to one of ordinary skill in the art the methods contemplated herein; the methods are not limited to these exemplary embodiments. Various steps in the manufacture of semiconductor devices are well known and so, in the interest of brevity, many conventional steps will only be mentioned briefly herein or will be omitted entirely without providing the well-known process details.

The semiconductor device 10 includes a semiconductor substrate 12. The semiconductor substrate 12 includes a silicon layer 11 that overlies a buried oxide layer 13 (see FIG. 2) that overlies a bulk substrate layer (not shown) to form an SOI substrate as is known in the art. In an exemplary embodiment, the silicon layer 11 is intrinsic silicon (undoped or pure silicon) having, for example, a (111) crystalline structure. As illustrated, the silicon layer 11 is etched to form a waveguide layer 14 between spaced apart trenches 15 to define a waveguide 16. In an exemplary embodiment, the trenches 15 are filled with an intervening material 18, e.g., silicon oxide or silicon nitride, so that together with the buried oxide layer 13 (FIG. 2) light will remain in the waveguide layer 14 via total internal reflection. As illustrated, a region of the waveguide layer 14 is designated for forming a photodetector and defines a detector region 20 (bounded by dashed line).

Figure 2:
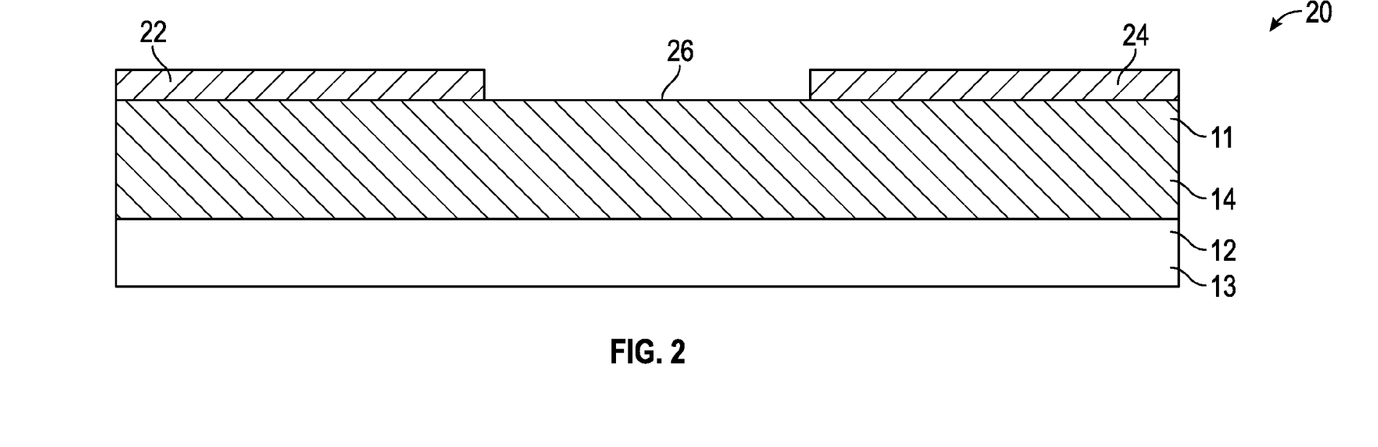
FIGS. 2-9 illustrate, in cross-sectional views, the semiconductor device at further advanced fabrication stages.

FIGS. 2-9 illustrate, in cross-sectional views along line 2-2 in the detector region 20 depicted in FIG. 1, the semiconductor device 10 at further advanced fabrication stages. Referring to FIG. 2, an oxide material, e.g., silicon oxide, is deposited overlying the waveguide layer 14 and is etched to form field oxide layer sections 22 and 24. The field oxide layer sections 22 and 24 are spaced apart from each other to expose an intermediate section 26 of the waveguide layer 14. In an exemplary embodiment, the oxide material is deposited and etched using well known deposition, patterning, and etching techniques such as chemical vapor deposition (CVD), lithography, dry etching, e.g., reactive ion etching (RIE), and the like.

Figure 3:
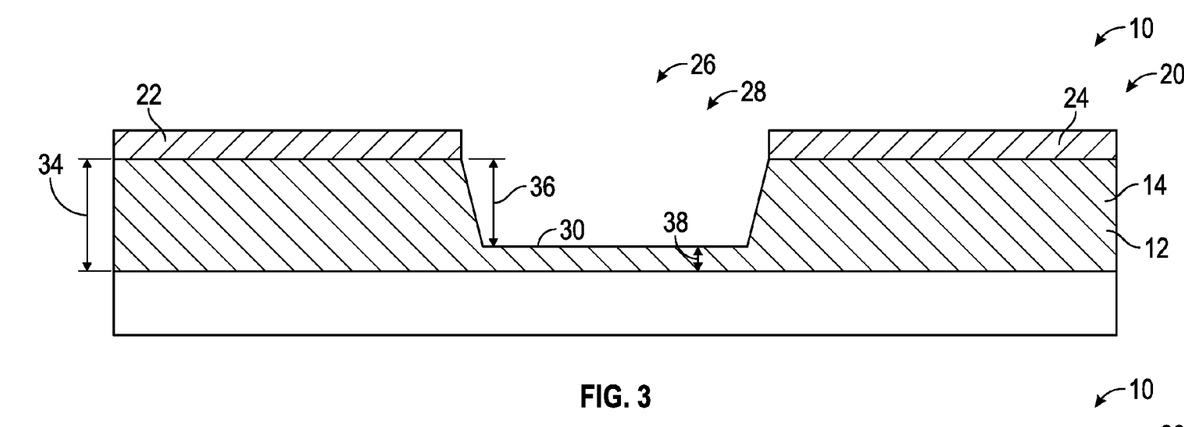

The process continues as illustrated in FIG. 3 by etching a trench 28 into the intermediate section 26 of the waveguide layer 14 to form a recessed waveguide layer section 30. In an exemplary embodiment, the trench 28 is formed by etching the intermediate section 26 using a wet etching process, such as wet chemical etching with an etchant such as KOH, TMAH, or the like. TMAH (tetra-methyl-ammonium-hydroxide) solution is commonly stocked in a 25% concentration. A desired etchant concentration, in an exemplary embodiment, can be achieved by mixing a desired amount of 25% TMAH solution with deionized water. In one example, a recipe includes 250 mL 25% TMAH and 375 mL deionized water, and is heated to 80° C. In an exemplary embodiment, the waveguide layer 14 has a thickness (indicated by double headed arrow 34) of from about 2 to about 3 μm and material (silicon) is removed from the waveguide layer 14 for a depth (indicated by double headed arrow 36) of from about 1.25 to about 2.75 μm to form the recessed waveguide layer section 30 that has a thickness (indicated by double headed arrow 38) of from about 0.25 to about 0.75 μm, such as about 0.5 μm.

Figure 4:
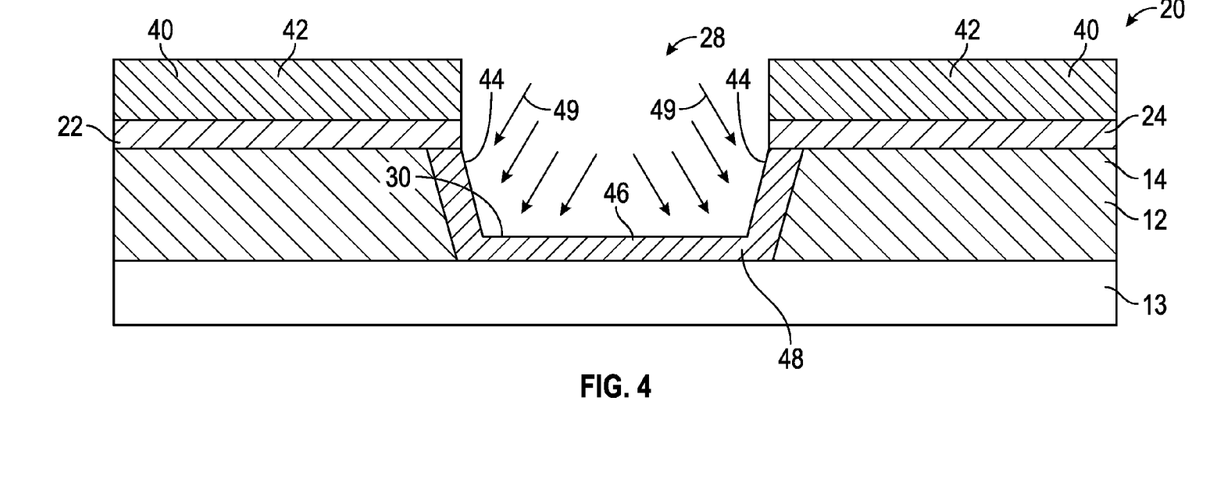

Referring to FIG. 4, a photoresist layer 40 is deposited and patterned using well known techniques to form a patterned photoresist layer 42. The patterned photoresist layer overlies the field oxide layer sections 22 and 24 while exposing the sidewalls 44 and the lower section 46 of the recessed waveguide layer section 30. The recessed waveguide layer section 30 is P− doped to form a P− charge layer 48. In an exemplary embodiment and as illustrated, the sidewalls 44 and the lower section 46 of the recessed waveguide layer section 30 are P− doped (indicated by arrows 49) by using the patterned photoresist layer 42 as a mask and angle implanting a P− dopant, such as B, $BF_2$, or the like, to form the P− charge layer 48. In an exemplary embodiment, the P− dopant is angle implanted at a dose of from about $1\times10^{12}$ to about $1\times10^{14}$ ions·cm$^{-2}$ and an accelerating voltage of from about 1 to about 100 KeV.

Figure 5:
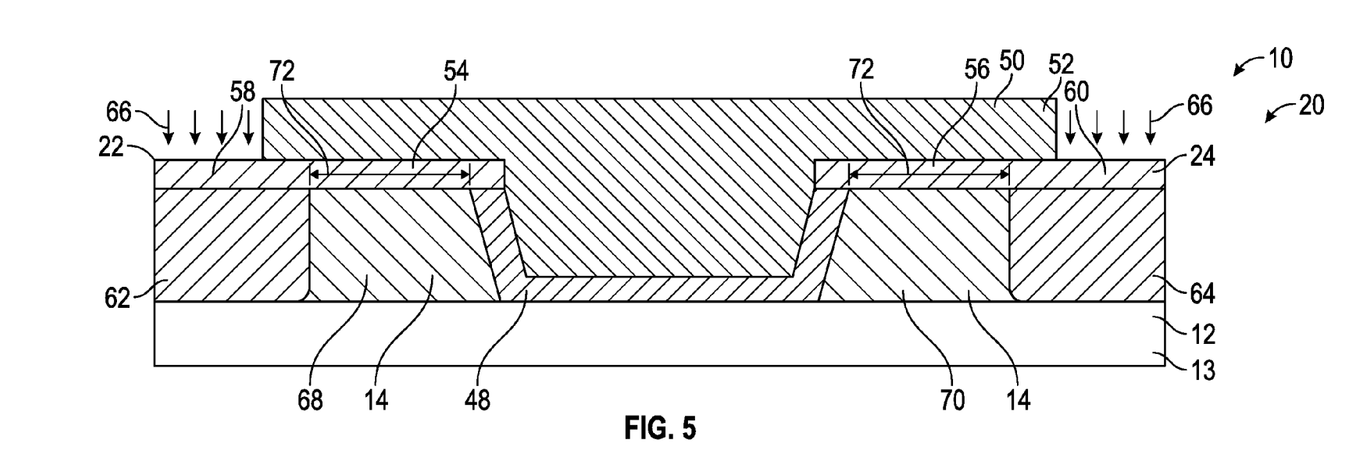

The process continues as illustrated in FIG. 5 by removing the patterned photoresist layer 42 and depositing and patterning a photoresist layer 50 using well known techniques to form a patterned photoresist layer 52. The patterned photoresist layer 52 overlies the P− charge layer 48 and proximal portions 54 and 56 of the field oxide layer sections 22 and 24 while exposing distal portions 58 and 60 of the field oxide layer sections 22 and 24. In an exemplary embodiment, n-wells 62 and 64 are formed in the waveguide layer 14 laterally spaced apart from the P− charge layer 48. In an exemplary embodiment, the n-wells 62 and 64 are formed by using the patterned photoresist layer 52 as a mask and implanting an n-well dopant (indicated by arrows 66), such as phosphorus (P) or the like, through the distal portions 58 and 60 of the field oxide layer sections 22 and 24 into portions of the waveguide layer 14 underlying the distal portions 58 and 60. In an exemplary embodiment, the n-well dopant is implanted at a dose of from about $1\times10^{12}$ to about $1\times10^{36}$ ions·cm$^2$ and an accelerating voltage of from about 100 to about 700 KeV.

The portions of the waveguide layer 14 disposed between the n-wells 62 and 64 and the P− charge layer 48 (e.g., portions of the waveguide layer 14 underlying the proximal portions 54 and 56 of the field oxide layer sections 22 and 24) define multiplication regions 68 and 70, respectively. In an exemplary embodiment, the multiplication regions 68 and 70 are formed of intrinsic silicon (i-Si). As illustrated, the multiplication regions 68 and 70 each have a width (indicated by double headed arrow 72) defined between the corresponding n-well 62 or 64 and the P− charge layer 48. It has been found that the widths 72 of the multiplication regions 68 and 70 affect the bias of the avalanche photodetector diode 100 (see FIG. 9) at various operating voltages. As such, depending upon the optical application of the semiconductor device 10, the widths 72 of the multiplication regions 68 and 70 can be adjusted to provide a desired reverse bias voltage for the avalanche photodetector diode 100 in relation to the particular operating voltage. In an exemplary embodiment, the widths 72 of the multiplication regions 68 and 70 are each from about 0.3 to about 1.5 μm.

Figure 6:
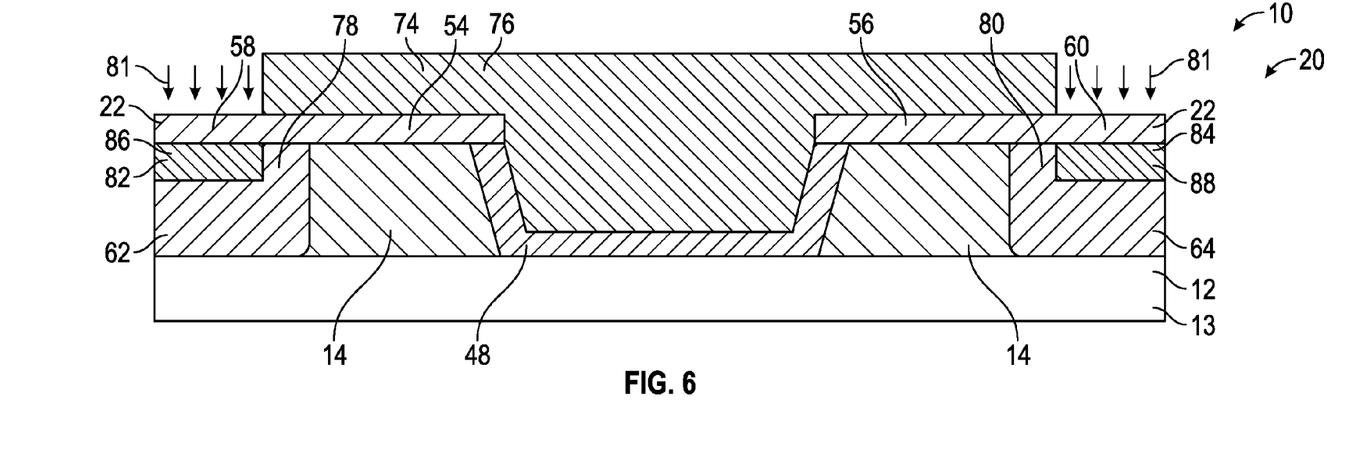

Referring to FIG. 6, the patterned photoresist layer 52 is removed and a photoresist layer 74 is deposited and patterned to form a patterned photoresist layer 76. As illustrated, the patterned photoresist layer 76 overlies the P− charge layer 48, the proximal portions 54 and 56 of the field oxide layer sections 22 and 24, and inboard portions 78 and 80 of the n-wells 62 and 64. In an exemplary embodiment, an N+ dopant (indicated by arrows 81), such as argon (Ar) or the like, is implanted into upper, outboard portions 82 and 84 of the n-wells 62 and 64 for forming N+ electrodes 86 and 88, respectively. In an exemplary embodiment, the N+ dopant is implanted 81 at a dose of from about $1\times10^{14}$ to about $1\times10^{16}$ ions·cm$^{-2}$ and an accelerating voltage of from about 1 to about 100 KeV, such as from about 1 to about 10 KeV. In an exemplary embodiment, once implanted, the N+ dopant is activated by annealing, e.g., rapid thermal annealing (RTA), flash annealing, laser annealing, or the like.

Figure 7:
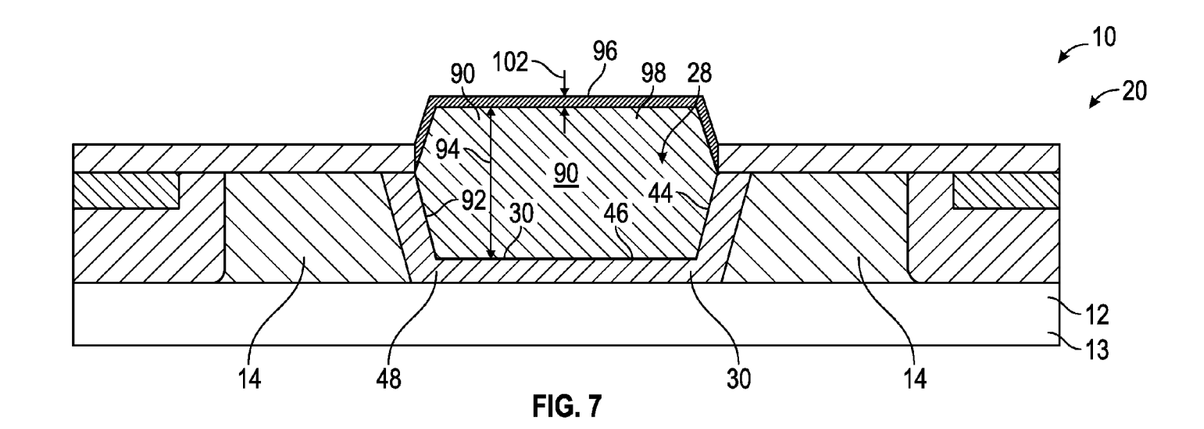

The process continues as illustrated in FIG. 7 by removing the patterned photoresist layer 76 to expose the trench 28 and the P− charge layer 48. The trench 28 is filled with germanium (Ge) to form an absorption region 90. In an exemplary embodiment, the silicon material at a surface 92 of the P− charge layer 48 (e.g., recessed waveguide layer section 30) including the sidewalls 44 and the lower section 46 have a (111) crystalline surface and Ge is selectively deposited into the trench 28 using an epitaxial growth process. In an exemplary embodiment, Ge is epitaxially grown on the surface 92 at a temperature of from about 560 to about 640° C. to a thickness (indicated by double headed arrow 94) of from about 2.5 to about 3.5 μm.

As illustrated, a Si cap 96 is deposited overlying the absorption region 90. In an exemplary embodiment, Si is selectively deposited onto an upper portion 98 of the absorption region 90 using an epitaxial growth process. In one example, Si is epitaxially grown on the upper portion 98 at a temperature of from about 560 to about 1100° C. to a thickness (indicated by arrows 102) of from about 5 to about 30 nm.

Figure 8:
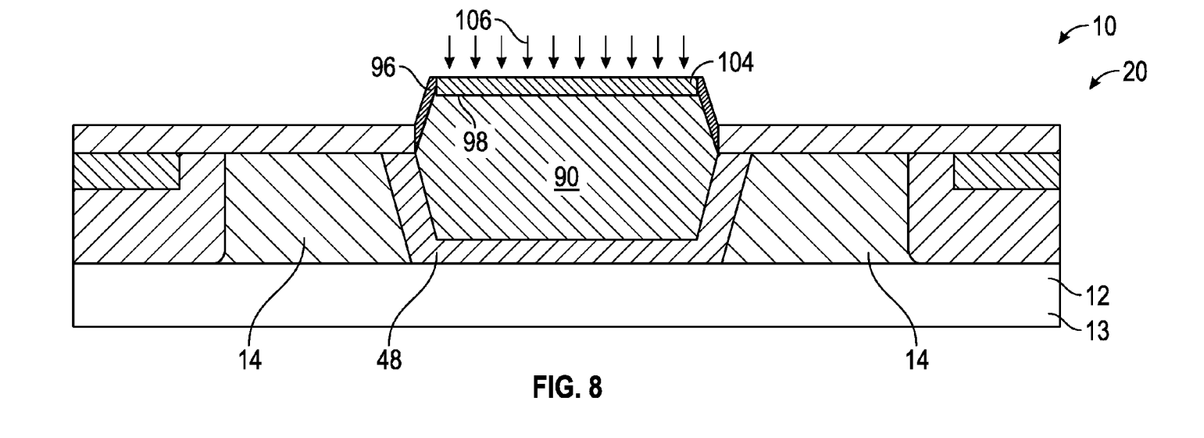

Referring to FIG. 8, a P+ electrode 104 is formed along the upper portion 98 of the absorption region 90. In an exemplary embodiment, the P+ electrode 104 is formed by implanting a P+ dopant (indicated by arrows 106), such as such as boron (B), $BF_2$, or the like, into the Si cap 96 and the upper portion 98 of the absorption region 90 to form the P+ electrode 104. In an exemplary embodiment, the P+ dopant is implanted at a dose of from about $1\times10^{14}$ to about $1\times10^{16}$ ions·cm$^{-2}$ and an accelerating voltage of from about 1 to about 100 KeV.

Figure 9:
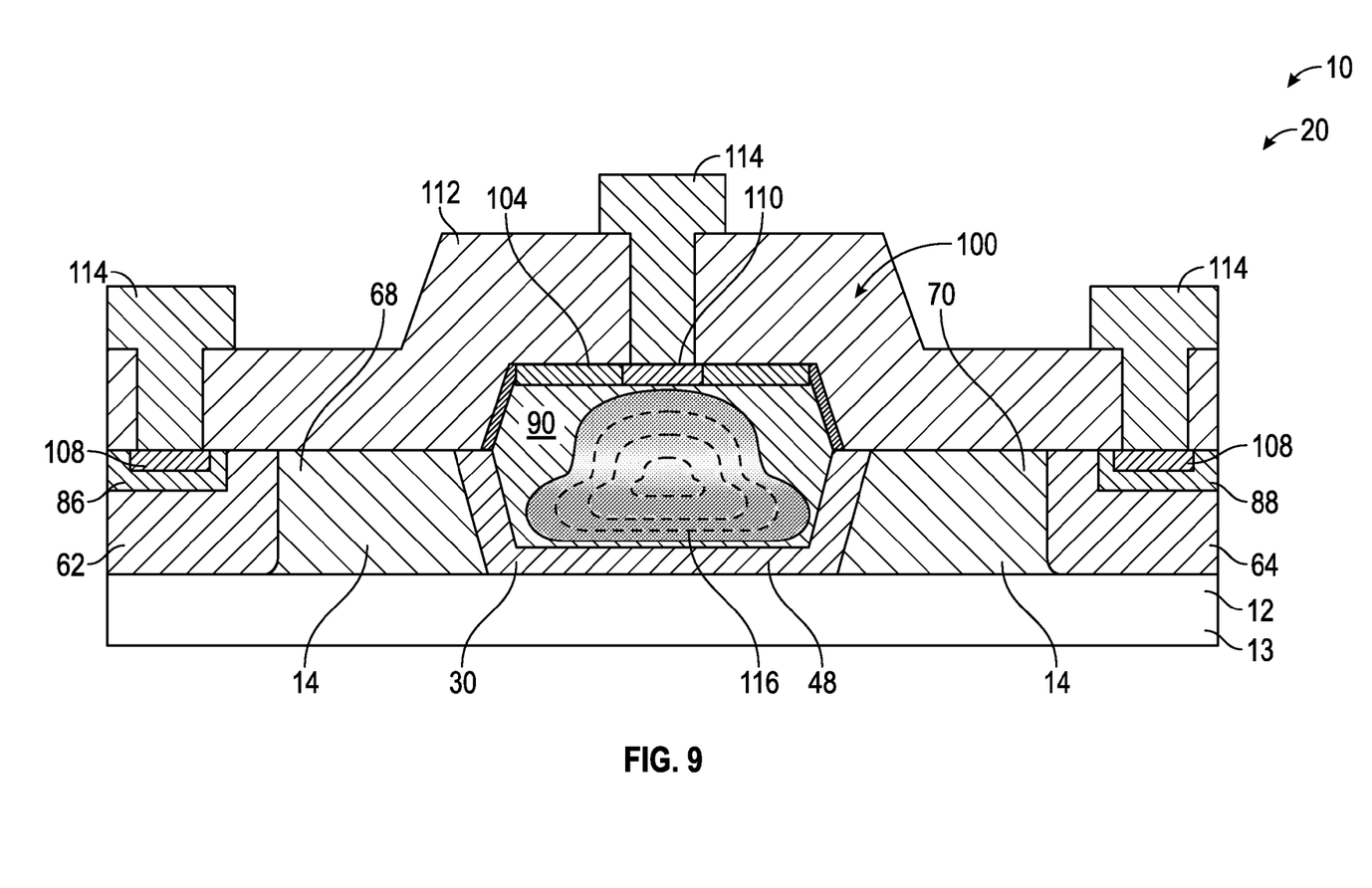

The process continues as illustrated in FIG. 9 by forming metal silicide regions 108 and 110 in the N+ electrodes 86 and 88 and the P+ electrode 104, respectively. In an exemplary embodiment, the metal silicide regions 108 and 110 are formed by depositing a refractory metal, such as, for example, cobalt, nickel, titanium, tantalum, platinum, palladium, and/or rhodium, onto the exposed portions of the N+ electrodes 86 and 88 and the P+ electrode 104 and subsequently performing one or more heat treatments to initiate a chemical reaction to form metal silicide. As illustrated, the absorption region 90, the P− charge layer 48, the multiplication regions 68 and 70, the n-wells 62 and 64, the N+ and P+ electrodes 86, 88, and 104, and the metal silicide regions 108 and 110 together form the avalanche photodetector diode 100.

An interlayer dielectric (ILD) layer 112 of a dielectric material, e.g., silicon oxide, is deposited overlying the avalanche photodetector diode 100. The dielectric material can be deposited, for example, by a conformal deposition process such as by CVD and the decomposition of a source material, such as tetraethylorthosilicate (TEOS) as is well known in the art.

Figure 10:
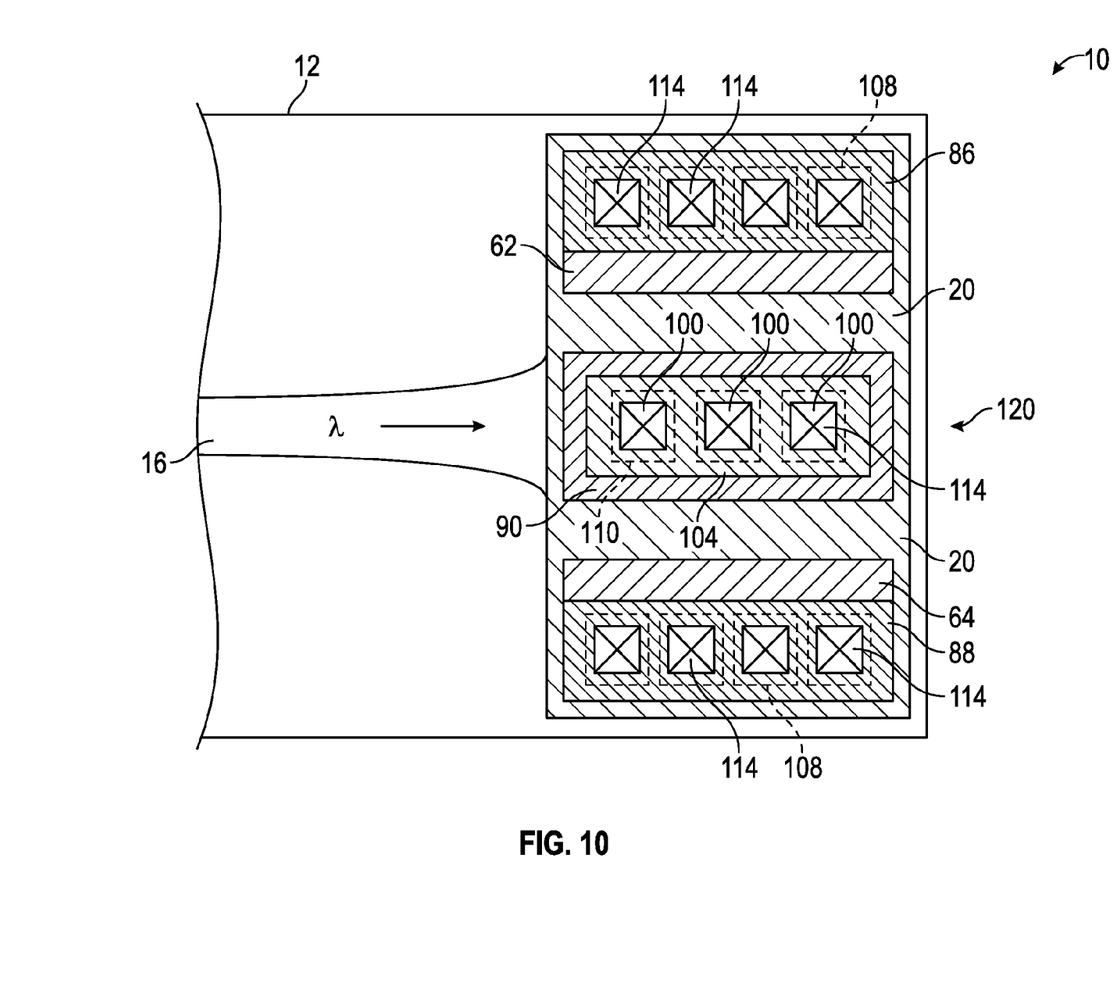
FIG. 10 illustrates, in top view, the semiconductor device at an advanced fabrication stage.

In an exemplary embodiment, contacts 114 of conductive material are formed extending through the ILD layer 112 to the metal silicide regions 108 and 110. The contacts 114 may be formed, for example, by dry etching contact trenches through the ILD layer 112 and depositing by CVD the conductive material to fill the contact trenches. Dashed line patterns 116 are representative of light being guided through the recessed waveguide layer section 30 to the avalanche photodetector diode 100 with carrier generation occurring in the absorption region 90 in response to the absorption of photons. Once generated, the carrier is multiplied in the multiplication regions 68 and 70 to increase the amplitude of the signal at an output of the avalanche photodetector diode 100. As illustrated in FIG. 10, the semiconductor device 10 can include multiple avalanche photodetector diodes 100 arranged, for example, in arrays 120 depending upon the particular optical application.

Accordingly, semiconductor devices including avalanche photodetector diodes integrated on waveguides and methods for fabricating such semiconductor devices have been described. In an exemplary embodiment, a semiconductor device is fabricated by etching a trench into a waveguide layer in a detector region of a semiconductor substrate. An avalanche photodetector diode is formed about the trench. Forming the avalanche photodetector diode includes forming a multiplication region in the waveguide layer laterally adjacent to the trench. An absorption region is formed at least partially disposed in the trench.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating a semiconductor device, the method comprising:
    etching a trench into a waveguide layer in a detector region of a semiconductor substrate, wherein etching the trench into the waveguide layer comprises removing material from the waveguide layer to expose a sidewall and a lower section of the waveguide layer to form the trench; and
    forming an avalanche photodetector diode about the trench comprising:
        forming a first multiplication region in the waveguide layer laterally adjacent to the trench, wherein forming the avalanche photodetector diode comprises P− doping the sidewall and the lower section to form a P− charge layer, and wherein forming the first multiplication region comprises forming the first multiplication region laterally adjacent to the P− charge layer; and
        forming an absorption region at least partially disposed in the trench, wherein forming the first multiplication region comprises forming an n-well in the waveguide layer laterally spaced apart from the P− charge layer to form the first multiplication region disposed between the n-well and the P− charge layer.

2. The method of claim 1, wherein forming the avalanche photodetector diode comprises forming a second multiplication region in the waveguide layer laterally adjacent to the trench, wherein the absorption region is disposed between the first and second multiplication regions.

3. The method of claim 1, wherein etching the trench into the waveguide layer comprises removing material from the waveguide layer for a depth of from about 1.25 to about 2.75 μm to form the trench.

4. The method of claim 1, wherein etching the trench into the waveguide layer comprises etching the trench into the waveguide layer using a wet etching process.

5. The method of claim 1, wherein forming the first multiplication region comprises forming the first multiplication region having a width defined between the n-well and the P− charge layer of from about 0.3 to about 1.5 μm.

6. The method of claim 1, wherein forming the avalanche photodetector diode comprises implanting an N+ dopant into a first upper portion of the n-well for forming an N+ electrode.

7. The method of claim 6, wherein forming the avalanche photodetector diode comprises activating the N+ dopant using an annealing process to form the N+ electrode.

8. The method of claim 6, wherein forming the avalanche photodetector diode comprises forming an P+ electrode along a second upper portion of the absorption region.

9. The method of claim 8, wherein forming the avalanche photodetector diode comprises forming a first metal silicide region in the N+ electrode and a second metal silicide region in the P+ electrode.

10. The method of claim 9, further comprising:
    depositing an ILD layer of dielectric material overlying the avalanche photodetector diode; and
    forming a first contact and a second contact extending through the ILD layer to the first and second metal silicide regions, respectively.

11. The method of claim 1, wherein forming the absorption region comprises filling the trench with germanium (Ge) using an epitaxial growth process.

12. A method for fabricating a semiconductor device, the method comprising:
    forming a first field oxide layer section and a second field oxide layer section overlying a waveguide layer in a detector region of a semiconductor substrate, wherein the first and second field oxide layer sections are spaced apart to expose an intermediate section of the waveguide layer;
    etching a trench into the intermediate section of the waveguide layer to form a recessed waveguide layer section having sidewalls and a lower section extending between the sidewalls;
    P− doping the sidewalls and the lower section to form a P− charge layer in the recessed waveguide layer section;
    forming a first n-well in the waveguide layer underlying the first field oxide layer section and laterally spaced apart from the P− charge layer to form a first multiplication region in the waveguide layer disposed between the first n-well and the P− charge layer;
    forming a second n-well in the waveguide layer underlying the second field oxide layer section and laterally spaced apart from the P− charge layer to form a second multiplication region in the waveguide layer disposed between the second n-well and the P− charge layer;
    N+ doping upper portions of the first and second n-wells for forming first and second N+ electrodes, respectively;

depositing germanium (Ge) into the trench overlying the P– charge layer to form an absorption region; and forming a P+ electrode along an upper portion of the absorption region.

13. The method of claim 12, wherein etching the trench into the intermediate section comprises forming the recessed waveguide layer section having a thickness of from about 0.25 to about 0.75 μm.

14. The method of claim 12, further comprising:
forming a silicon (Si) cap overlying the absorption region.

15. The method of claim 14, wherein forming the P+ electrode comprises P+ doping the Si cap and the upper portion of the absorption region.

16. The method of claim 12, wherein N+ doping the upper portions of the first and second n-wells comprises implanting an N+ dopant through the first and second field oxide layer sections into the upper portions of the first and second n-wells for forming the first and second N+ electrodes, respectively.

17. The method of claim 12, wherein P– doping the sidewalls and the lower section comprises angle implanting a P– dopant into the sidewalls and the lower section.

* * * * *